(12) United States Patent
Tatebe et al.

(10) Patent No.: US 9,252,514 B2
(45) Date of Patent: Feb. 2, 2016

(54) CONNECTOR

(71) Applicant: Japan Aviation Electronics Industry, Limited, Tokyo (JP)

(72) Inventors: Yu Tatebe, Tokyo (JP); Seiya Matsuo, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 14/556,421

(22) Filed: Dec. 1, 2014

(65) Prior Publication Data

US 2015/0222034 A1  Aug. 6, 2015

(30) Foreign Application Priority Data

Feb. 4, 2014  (JP) .................. 2014-019388

(51) Int. Cl.
*H01R 12/00* (2006.01)
*H01R 12/71* (2011.01)
*H01R 13/24* (2006.01)
*H01R 12/70* (2011.01)
*H05K 3/32* (2006.01)
*H05K 7/10* (2006.01)

(52) U.S. Cl.
CPC .......... *H01R 12/714* (2013.01); *H01R 12/7082* (2013.01); *H01R 13/2435* (2013.01); *H05K 3/32* (2013.01); *H05K 7/1069* (2013.01)

(58) Field of Classification Search
CPC ............ H01R 12/714; H01R 12/7082; H01R 13/2435; H05K 3/32; H05K 7/1069
USPC .......................... 439/65, 66, 77, 91, 626, 660
See application file for complete search history.

(56) References Cited

U.S. PATENT DOCUMENTS

| 7,354,277 | B2* | 4/2008 | Hougham | H05K 3/326 439/66 |
| 7,887,336 | B2* | 2/2011 | Nikaido | H01L 23/49827 439/591 |
| 8,109,768 | B2* | 2/2012 | Nikaido | H01R 12/57 174/262 |
| 2009/0197437 | A1 | 8/2009 | Ouchi et al. | |

FOREIGN PATENT DOCUMENTS

| JP | 2007-323833 A | 12/2007 |
| JP | 2007-328996 A | 12/2007 |
| JP | 2008-21637 A | 1/2008 |

* cited by examiner

*Primary Examiner* — Khiem Nguyen
(74) *Attorney, Agent, or Firm* — Collard & Roe, P.C.

(57) ABSTRACT

A contact unit includes a first conduction path in the form of a thin film arranged along a peripheral surface of an insulating elastic body, a second conduction path arranged along the first conduction path, and a connecting conduction path electrically connecting the first and second conduction paths to each other. A frame has a through hole. The frame supports the contact unit so that the first conduction path exposed from both openings of the through hole is brought into contact with connection objects and that the second conduction path is entirely received in the through hole.

10 Claims, 22 Drawing Sheets

1) Machining of Elastomer

2) Pushing Up of Tongue Portion

3) Insertion of Metal Terminal

4) Release Pushing Up of Tongue Portion

5) Insertion Completed

CONNECTOR

This application is based upon and claims the benefit of priority from Japanese Patent Application No. 2014-019388, filed on Feb. 4, 2014, the disclosure of which is incorporated herein in its entirety by reference.

BACKGROUND OF THE INVENTION

1. Field of the Invention

This invention relates to a connector and, in particular, relates to a connector in which a conduction path in the form of a conductor thin film is provided on a surface of an elastic body and this elastic body passes through and is supported by a through hole provided in an insulating frame. This type of connector is used for establishing electrical connection between connection objects such as between a board and a board or between a board and a semiconductor chip.

2. Description of Related Art

Use has been made of a connector in which a conduction path in the form of a conductor thin film is provided on a columnar body in the form of an elastic body so as to extend from an upper surface of the columnar body through a side surface thereof to a lower surface thereof and this columnar body is supported by a frame. With this type of connector, connection objects are respectively disposed on the upper and lower sides of the columnar body and fixed relative to the columnar body while holding the columnar body therebetween. In this event, the columnar body is elastically deformed to generate a reaction force. Using this reaction force, contacts between terminals of the connection objects and the conduction path on the upper and lower surfaces of the columnar body are maintained, thereby providing a stable conducting path between the two connection objects.

These contacts between the connector and the connection objects respectively occur between the thin film on the upper and lower surfaces of the columnar body and the terminals on the connection object sides. Even if a surface of a mating-side terminal has unevenness or is slightly inclined, a thin film provided on, such as bonded to, a surface of an elastic body can flexibly follow the surface of the mating-side terminal to achieve good surface-to-surface contact therebetween. Consequently, it is possible to suppress the contact resistance.

This type of conventional connector often uses a thin film as a conduction path as described above and thus the calorific value tends to be high so that it is difficult to increase the current capacity. While it is easy to suppress the resistance of a conduction path using no thin film, it is difficult in this case to suppress the contact resistance between a connector and a connection object.

Herein, "current capacity" represents a maximum current that can be supplied to a connector or a contact of a connector. Generally, when a current flows through a contact, the Joule heat is generated. This heat is transferred to connection objects, such as a board and a semiconductor chip, connected to a connector and further transferred to cables connected to the connection objects, various insulator members, and so on and is finally dissipated to an external space. The temperature of the connector or the contact is determined based on the balance between the heat generation and the heat dissipation described above.

In a connector, what tends to be most affected by heat is an insulator member. Generally, the continuous use temperature is determined for an insulator member. The continuous use temperature is a standard for long-term material property evaluation (heat resistance) prescribed in the UL (Underwriters Laboratories Inc.) Standard. In order not to impair the function of a connector, it is required to use the connector at or below the continuous use temperature.

According to the Joule's law, the Joule heat is proportional to the square of the current and to the resistance. Therefore, when the continuous use temperature of an insulator material and the resistance of a conduction path in a connector are determined, the maximum current that can be supplied without impairing the function of the connector is inevitably determined. This maximum current is defined as the current capacity.

This type of connector is described in JP-A-2008-21637 (hereinafter referred to as "Patent Document 1"). As shown in FIG. 20, the connector described in Patent Document 1 comprises an elastomer sheet having through holes 101 each provided therein with a conduction path 102. By providing the conduction path 102 in the through hole 101, broad conduction surfaces are ensured on front and back surfaces of the elastomer sheet. However, since the conduction path 102 is entirely formed by a thin film, its cross-sectional area is small. Consequently, it is difficult to reduce the resistance of the conduction path 102 as a whole.

JP-A-2007-323833 (hereinafter referred to as "Patent Document 2") describes a connector comprising, as shown in FIG. 21, a metal fitting 111 that holds an elastomer between its arm portions (see paragraph [0032] of Patent Document 2). In this case, the metal fitting 111 serves as a conduction path. As shown in FIG. 21, the metal fitting 111 is formed by bending a metal plate having a thickness large enough to maintain its shape alone. When such a metal fitting 111 is used, contact between itself and a terminal on the connection object side may be point-to-point contact or surface-to-surface contact with a relatively small contact area, but cannot be surface-to-surface contact with a certain large contact area. Further, it is difficult to ensure surface-to-surface contact regardless of unevenness or inclination of a surface of the terminal on the connection object side. Consequently, it is difficult to reduce the contact resistance when the metal fitting 111 is in contact with the terminal on the connection object side.

JP-A-2007-328996 (hereinafter referred to as "Patent Document 3") describes a connector comprising, as shown in FIG. 22, an elastomer plate 122 formed with a Π-shaped slit 120 along the peripheral edge of a metal terminal disposing region and thus with a tongue portion 121, which serves as the metal terminal disposing region, on the inner side of the slit 120 and a Π-shaped metal terminal 123 having a main post portion and a pair of arm portions extending from both ends of the main post portion and holding the tongue portion 121 therebetween (see paragraph [0024] of Patent Document 3). In the manufacture of this connector, the metal terminal 123 is formed by bending a metal plate in advance and then is fitted over the tongue portion 121 or, alternatively, a metal plate is first inserted through the slit 120 and then is bent and formed into the metal terminal 123 (see paragraphs [0036] to [0038] of Patent Document 3). As is also clear from this, the metal terminal 123 is formed by bending the metal plate having a certain thickness like the metal fitting 111 described in Patent Document 2. Consequently, as Patent Document 2, it is difficult to ensure surface-to-surface contact and thus to reduce the contact resistance, which, however, can be satisfactorily achieved by a thin film.

SUMMARY OF THE INVENTION

This invention has been made under these circumstances and it is an object of this invention to provide a connector that achieves both good surface-to-surface contact with connection objects and high current capacity.

According to an aspect of the present invention, a connector adapted to be held between two connection objects for electrically connecting the two connection objects to each other and comprising a contact unit and a frame is provided. The contact unit comprises: an insulating elastic body; a first conduction path comprising a conductor thin film that is arranged along a peripheral surface of the elastic body; a second conduction path comprising a conductor that is arranged along the conductor thin film of the first conduction path; and a connecting conduction path electrically connecting the first conduction path and the second conduction path to each other. The frame is non-conductive and has a through hole passing through the frame. The frame supports the contact unit so that the second conduction path is entirely received in the through hole. The frame supports the contact unit so that the first conduction path exposed from one of openings of the through hole is brought into contact with one of the two connection objects, while the first conduction path exposed from the other of the openings of the through hole is brought into contact with the other of the two connection objects.

The elastic body may be columnar and a plurality of first conduction paths may be arranged at a predetermined pitch in a longitudinal direction of the columnar elastic body. In this case, it is preferable that the frame supports the contact unit so that the first conduction paths are brought into contact with one of the two connection objects at one side in a short-side direction of the columnar elastic body and brought into contact with the other of the two connection objects at the other side in the short-side direction of the columnar elastic body and mutually independent conducting paths are established between the two connection objects through the first conduction paths.

The connector may further comprise a plurality of columnar elastic bodies, wherein the frame comprises a plurality of through holes each corresponding to one of the columnar elastic bodies.

It is preferable that: the first conduction path may have a belt-like shape; the second conduction path has a width equal to that of the first conduction path; and the second conduction path comprises a plate-like conductor member having a thickness greater than that of the first conduction path.

The connecting conduction path may be formed by joining a part or the whole of the second conduction path to the first conduction path.

The second conduction path may be arranged between the first conduction path and the elastic body.

It is preferable that: the first conduction path is arranged between the second conduction path and the elastic body; and the connecting conduction path is formed by joining a part or the whole of the second conduction path to the first conduction path.

The connector may further comprise a third conduction path that is formed by the thin film of the first conduction path and is independent from the second conduction path and a connecting conduction path that electrically connects the first conduction path and the third conduction path to each other, wherein the first conduction path is arranged between the second conduction path and the third conduction path.

The connector may further comprise a columnar body comprising the elastic body at each of upper and lower end portions thereof and a conductor serving as the second conduction path between the upper and lower end portions, wherein the conductor thin film of the first conduction path is arranged along a peripheral surface of the columnar body.

The connector may further comprise an insulating film, wherein the insulating film has a through hole, and wherein the connecting conduction path passes through the through hole of the insulating film.

Effect of the Invention

According to a first aspect of this invention, a contact unit is supported by a frame so that a second conduction path connected to a first conduction path is entirely received in a through hole of the frame. Since the second conduction path is entirely received in the frame, the second conduction path does not hinder elastic deformation of an elastic body and the first conduction path arranged along a peripheral surface of the elastic body. Therefore, it is possible to reduce the resistance of the first conduction path between its terminals while well maintaining surface-to-surface contact between the first conduction path and connection objects. As a result, a connector with high current capacity can be obtained.

DESCRIPTION OF THE EXEMPLARY EMBODIMENTS

Figure 1:
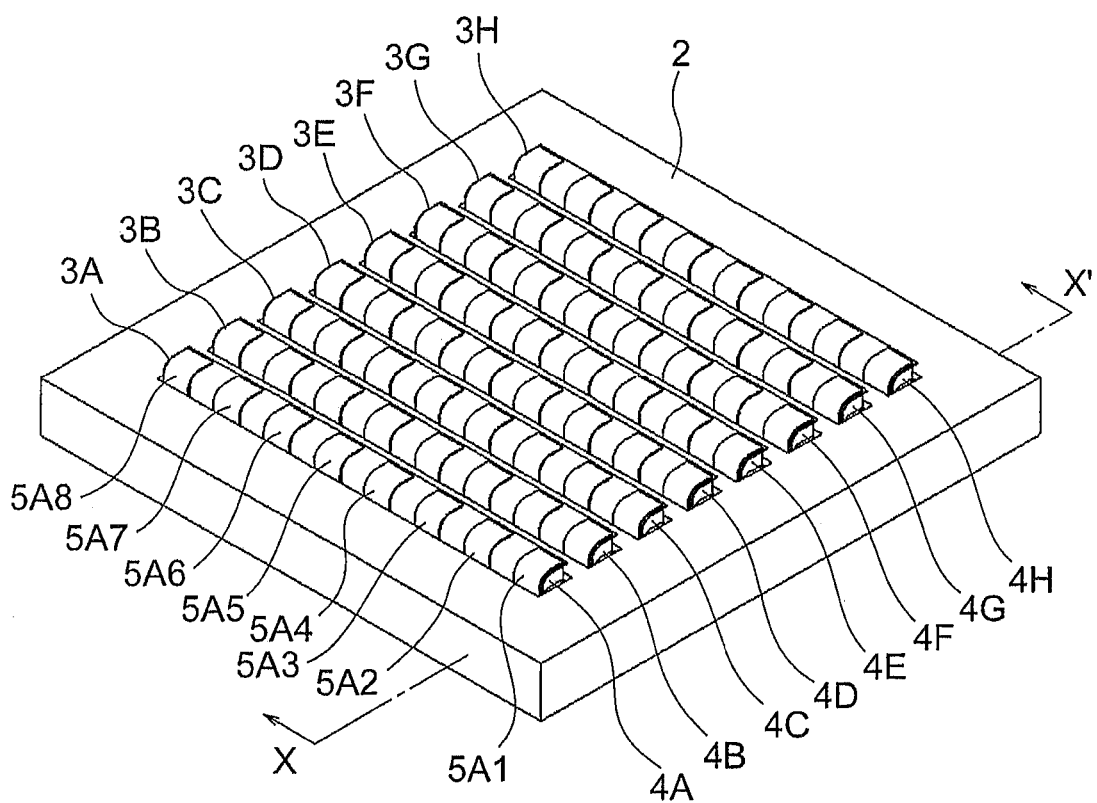
FIG. 1 is a perspective view of a connector 1 according to an embodiment of this invention.

Referring to the drawings, a connector 1 according to an embodiment of this invention will be described. The connector 1 is used for electrically connecting two connection objects to each other. For example, the connection objects may both be boards or, alternatively, may be a semiconductor package such as LGA (Land Grid Array) or BGA (Ball Grid Array) and a board. The connection objects can be electrically connected to each other by attaching the connector 1 therebetween.

As shown in FIG. 1, the connector 1 comprises a frame 2. The frame 2 is a plate-like member made of an insulating material such as a plastic. The frame 2 has eight slits 3A to 3H each being a hole passing through the frame 2 from its upper surface to its lower surface.

The connector 1 further comprises eight contact units 4A to 4H. Each of the contact units 4A to 4H is supported by a corresponding one of the slits 3A to 3H. As shown in FIG. 1, the contact units 4A to 4H are respectively supported by the slits 3A to 3H such that their upper end portions protrude from the upper surface of the frame 2. Although not illustrated in FIG. 1, lower end portions of the contact units 4A to 4H also protrude from the slits 3A to 3H on the lower side of the frame 2. Eight first conduction paths are disposed on columnar body side surfaces of each of the contact units 4A to 4H. For example, the contact unit 4A is provided with first conduction paths 5A1 to 5A8. Since the eight contact units 4A to 4H are each provided with eight first conduction paths, 64 (=8×8) contact points protrude on the upper side of the frame 2 and, likewise, 64 (=8×8) contact points protrude also on the lower side of the frame 2.

Figure 6:
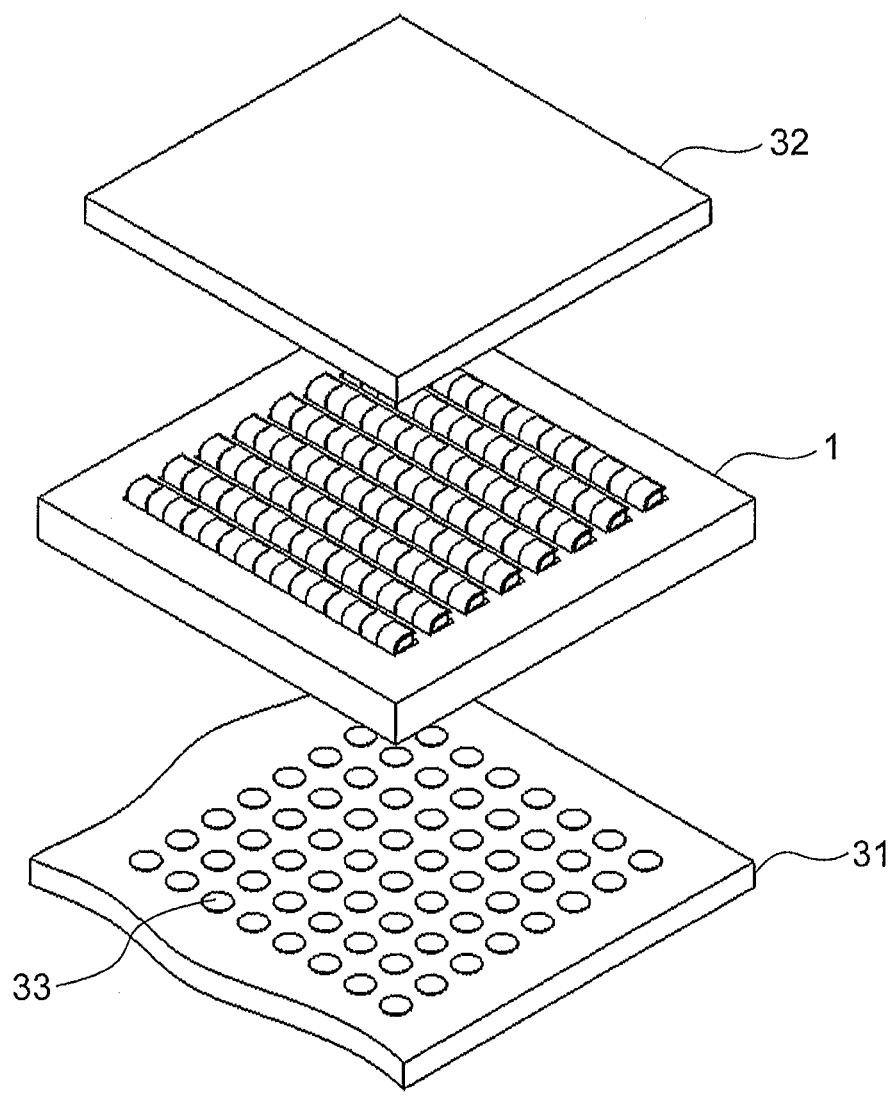
FIG. 6 is a perspective view showing a positional relationship just before connecting the connector 1 and boards 31 and 32 as its connection objects to each other.
Figure 7:
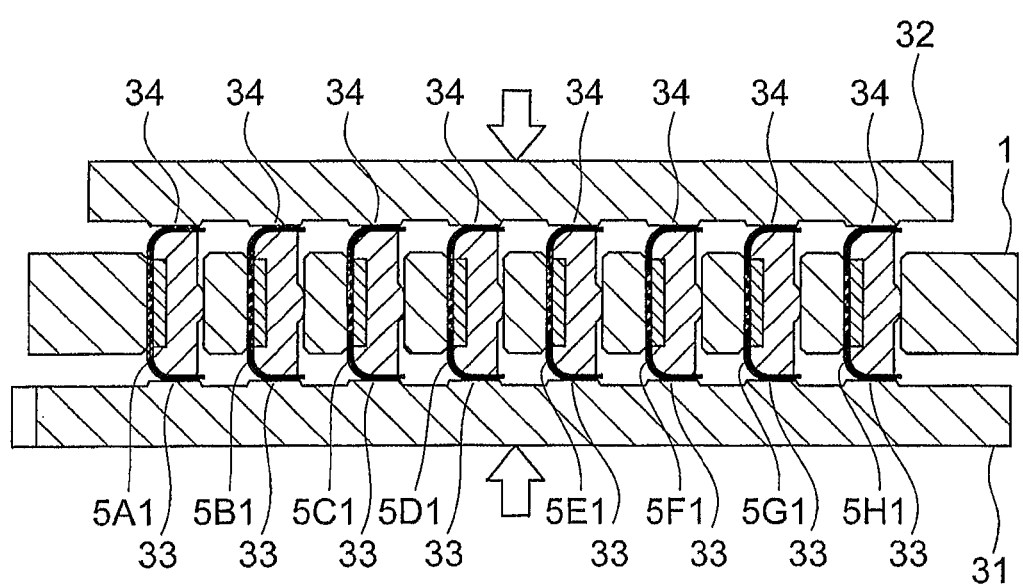
FIG. 7 is a cross-sectional view showing the process of connecting the connector 1, the board 31, and the board 32 to each other.

As will be described later, in this embodiment, as shown in FIGS. 6 and 7, the connector 1 is first interposed between a board 31 and a board 32 as connection objects, then the board 32 and the connector 1 are pressed to the board 31, and then the board 31, the connector 1, and the board 32 are fixed together by a non-illustrated fixture.

A total of 64 terminals 33 are provided in an 8×8 matrix on an upper surface of the board 31. When the terminals 33 are brought into surface-to-surface contact with the first conduction paths, each in the form of a conductor thin film, protruding on the lower side of the frame 2, the connector 1 and the board 31 are electrically connected to each other.

Likewise, 64 terminals 34 are provided on a lower surface of the board 32. When the terminals 34 are brought into surface-to-surface contact with the conductor thin films of the first conduction paths protruding on the upper side of the frame 2, the connector 1 and the board 32 are electrically connected to each other.

When, in this manner, the connector 1 and the board 31 are electrically connected to each other and the connector 1 and the board 32 are electrically connected to each other, the board 31 and the board 32 are electrically connected to each other through the connector 1. In this event, since the contacts between the connector 1 and the board 31 and the contacts between the connector 1 and the board 32 are respectively surface-to-surface contacts, the contact resistance can be suppressed to be low.

The contact units 4A to 4H will be further described. Since the contact units 4A to 4H have the same structure, only the contact unit 4A will be described herein with reference to FIGS. 2 and 3 for brevity of description.

The contact unit 4A comprises a columnar elastic body 10A. The columnar elastic body 10A is a columnar member made of an insulating elastic material such as a silicone rubber. Quite roughly, the columnar elastic body 10A has a shape close to a rectangular prism. Three of four side surfaces thereof are covered with an insulating film 11A made of polyimide or the like. The film 11A is fixedly bonded with an adhesive to the columnar elastic body 10A. Preferably, the hardness of the adhesive is close to the hardness of the columnar elastic body 10A. On the film 11A, the first conduction paths 5A1 to 5A8 are arranged at a predetermined pitch in a longitudinal direction of the columnar elastic body 10A.

The first conduction paths 5A1 to 5A8 are each in the form of a belt-like conductor thin film. The first conduction paths 5A1 to 5A8 each have, for example, a three-layer structure in which a copper layer of 12 μm thick, a nickel layer of 1 μm thick, and a gold layer of 0.1 μm thick are laminated in this order from the film 11A side. Specifically, the first conduction paths 5A1 to 5A8 each in the form of the laminated thin film can be formed by, for example, coating copper on the entire surface of the film 11A, then removing by etching the copper in regions other than regions where the first conduction paths 5A1 to 5A8 are to be formed, then plating nickel on the remaining copper, and then plating gold on the nickel.

The film 11A is exposed between the first conduction paths 5A1 to 5A8. Further, support holes 12A are respectively provided between the first conduction paths 5A1 to 5A8. In the slit 3A, non-illustrated support convex portions are provided at positions corresponding to the support holes 12A. When the contact unit 4A is inserted into the slit 3A, the support convex portions are fitted into the corresponding support holes 12A so that the contact unit 4A is fixedly supported by the frame 2.

Figure 3:
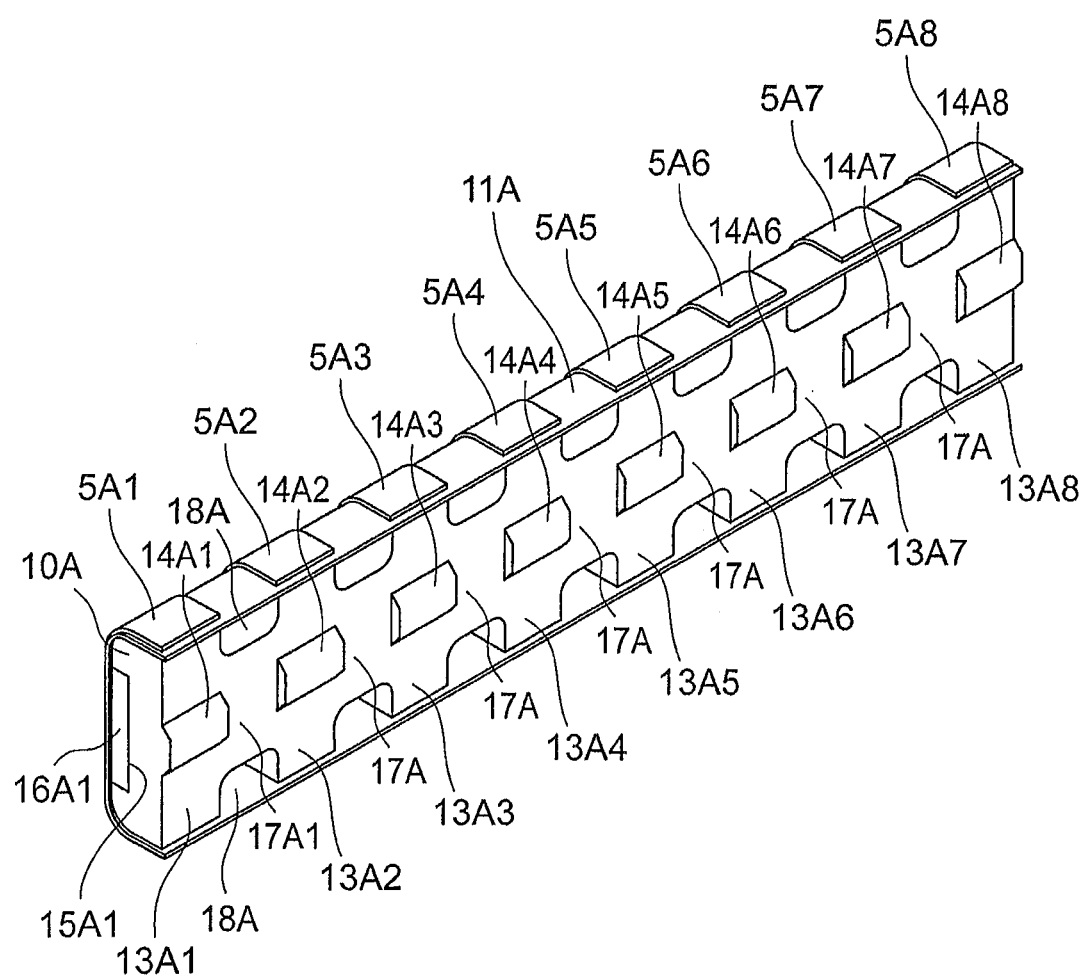
FIG. 3 is a rear perspective view of the contact unit 4A of the connector 1.

The shape of the columnar elastic body 10A will be described in further detail. As best shown in FIG. 3, the columnar elastic body 10A has a shape in which thick portions and thin portions are alternately arranged side by side in the longitudinal direction of the columnar elastic body 10A.

On side surfaces of the thick portions, i.e. conduction path support portions 13A1 to 13A8, the first conduction paths 5A1 to 5A8 are disposed through the film 11A. In the middle of a surface, on the side not covered with the film 11A, of each of the conduction path support portions 13A1 to 13A8, a corresponding one of support projections 14A1 to 14A8 is provided. For example, the length from a top end of the support projection 14A1 to a surface of the first conduction path 5A1 is set to be slightly greater than that of the slit 3A in its short-side direction, i.e. in a direction perpendicular to a longitudinal direction of the slit 3A. Therefore, when the contact unit 4A is inserted into the slit 3A, the support projection 14A1 is pressed and deformed by an inner wall of the slit 3A. This also applies to the other support projections 14A2 to 14A8. Consequently, the columnar elastic body 10A generates a reaction force and further a friction force is generated between the inner wall of the slit 3A and the support projections 14A1 to 14A8. With the help of the reaction force, the friction force, and the engagement between the support convex portions and the support holes 12A described above, the contact unit 4A is supported by the frame 2.

Further, the conduction path support portions 13A1 to 13A8 are respectively formed with second conduction path support holes 15A1 to 15A8. The second conduction path support hole 15A1 is a non-through hole having a rectangular opening along the first conduction path 5A1. The length of the rectangular opening in its short-side direction is equal to the width of the first conduction path 5A1. The depth of the hole is, for example, about 0.1 mm.

A second conduction path 16A1 is received in the second conduction path support hole 15A1. The second conduction path 16A1 is a rectangular plate-like conductor and is preferably made of a metal with a high conductivity, such as a copper alloy. The width of the second conduction path 16A1 is equal to that of the first conduction path 5A1. The thickness of the second conduction path 16A1 is equal to the depth of the second conduction path support hole 15A1 and thus is, for example, about 0.1 mm. Although not illustrated, the above also applies to the second conduction path support holes 15A2 to 15A8 and second conduction paths 16A2 to 16A8. Accordingly, like the second conduction path 16A1, the second conduction paths 16A2 to 16A8 are respectively received in the second conduction path support holes 15A2 to 15A8. The second conduction paths 16A1 to 16A8 are respectively connected to the first conduction paths 5A1 to 5A8 through holes provided in the film 11A.

For example, as will be described later, several holes each penetrating the film 11A are provided in a region, covering the second conduction path 16A1, of the film 11A and, through these holes, connecting conduction paths are provided for electrically connecting the first conduction path 5A1 and the second conduction path 16A1 to each other. The connecting conduction paths are formed by, for example, connecting the first conduction path 5A1 and the second conduction path 16A1 to each other through the holes by plating, soldering, laser welding, or ultrasonic joining.

By connecting the first conduction path 5A1 and the second conduction path 16A1 to each other through the connecting conduction paths, the same effect as obtained by increasing the cross-sectional area of a portion, overlapping the second conduction path 16A1, of the first conduction path 5A1 can be obtained. As a result, it is possible to reduce the resistance of the first conduction path 5A1 from its upper end portion to its lower end portion.

The thin portions of the columnar elastic body 10A, i.e. connecting portions 17A, each connect adjacent two of the conduction path support portions 13A1 to 13A8 to each other at a predetermined pitch. Consequently, the first conduction paths 5A1 to 5A8 and the second conduction paths 16A1 to 16A8 are arranged at the predetermined pitch.

Since the connecting portions 17A are thinner than the conduction path support portions 13A1 to 13A8, spaces respectively exist adjacent to upper end portions and lower end portions of the conduction path support portions 13A1 to 13A8. For example, spaces 18A exist between the conduction path support portion 13A1 and the conduction path support portion 13A2.

As will be described later, when the connector 1 connects between two connection objects, the upper and lower end portions of the conduction path support portions 13A1 to 13A8 are respectively pushed by forces received from the connection objects and thus attempt to expand laterally in the figure. In this event, if there is no space 18A, since there is no room for expansion of those end portions, the load required for each of those end portions to expand increases rapidly. On the other hand, if the spaces 18A exist, those end portions expand smoothly so that the sudden change in load can be avoided.

Further, by the presence of the spaces 18A, it is possible for the upper and lower end portions of the conduction path support portions 13A1 to 13A8 to contact with the connection object at contact angles which differ from each other. For example, it is assumed that a terminal on the connection object side corresponding to the upper end portion of the conduction path support portion 13A1 is horizontal, while a terminal on the connection object side corresponding to the upper end portion of the adjacent conduction path support portion 13A2 is inclined, i.e. not horizontal. This may occur, for example, when the connection object is a board and a part of the board is warped. In this event, by the presence of the spaces 18A, the upper end portion of the conduction path support portion 13A1 and the upper end portion of the adjacent conduction path support portion 13A2 can orient at angles which differ from each other. If there is no space 18A so that the elastic body is filled between both upper end portions, since the movement of the one affects the movement of the other, it is difficult for both upper end portions to orient independently in different directions from each other.

Figure 4:
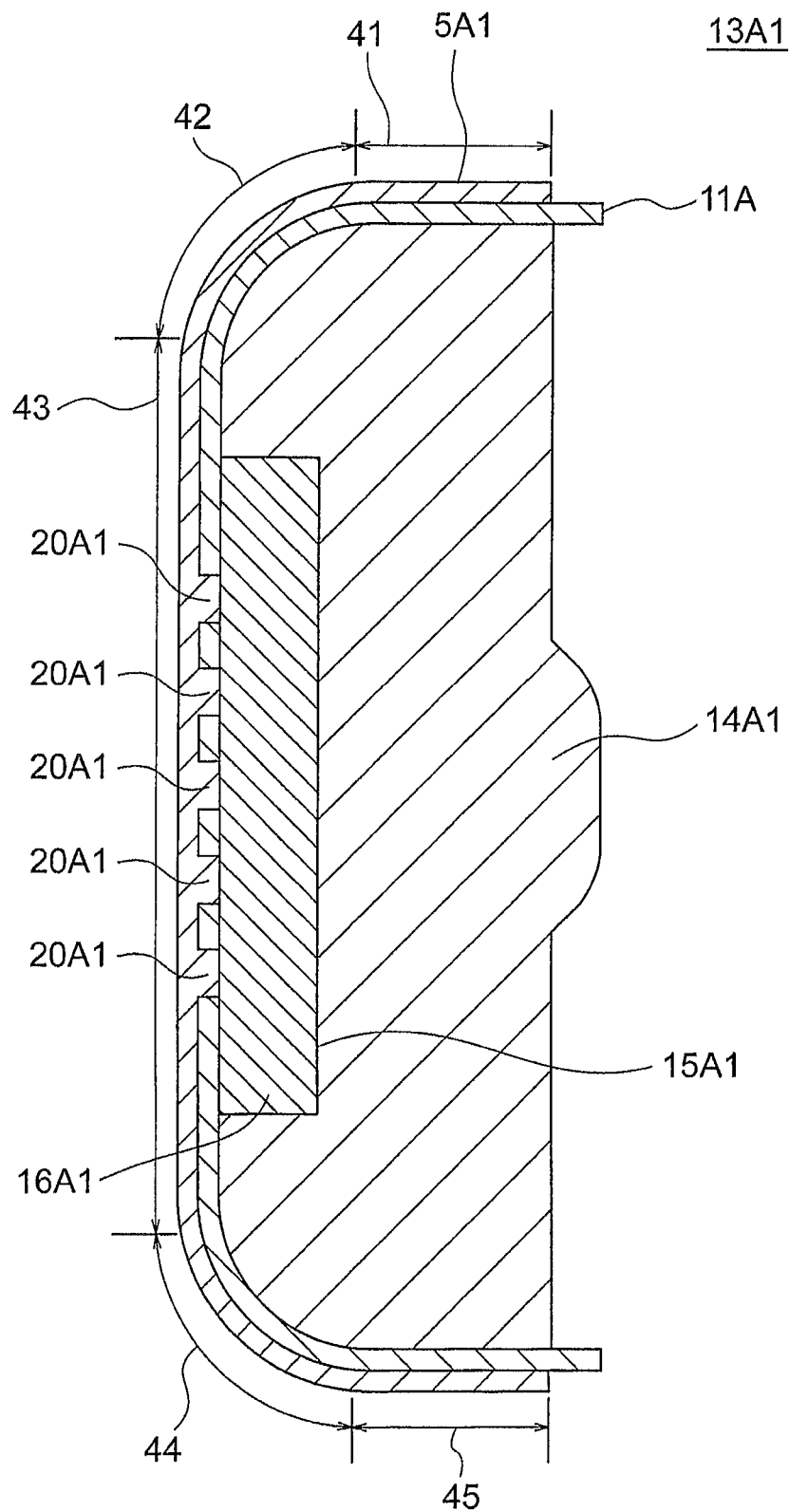
FIG. 4 is a cross-sectional view of a conduction path support portion 13A1 which is a part of the contact unit 4A.

The conduction path support portions 13A1 to 13A8 will be further described. As shown in FIG. 4 and as described above, five through holes are provided in a region, covering the second conduction path 16A1, of the film 11A and, through these holes, connecting conduction paths 20A1 are provided to electrically connect the first conduction path 5A1 and the second conduction path 16A1 to each other.

Figure 5:
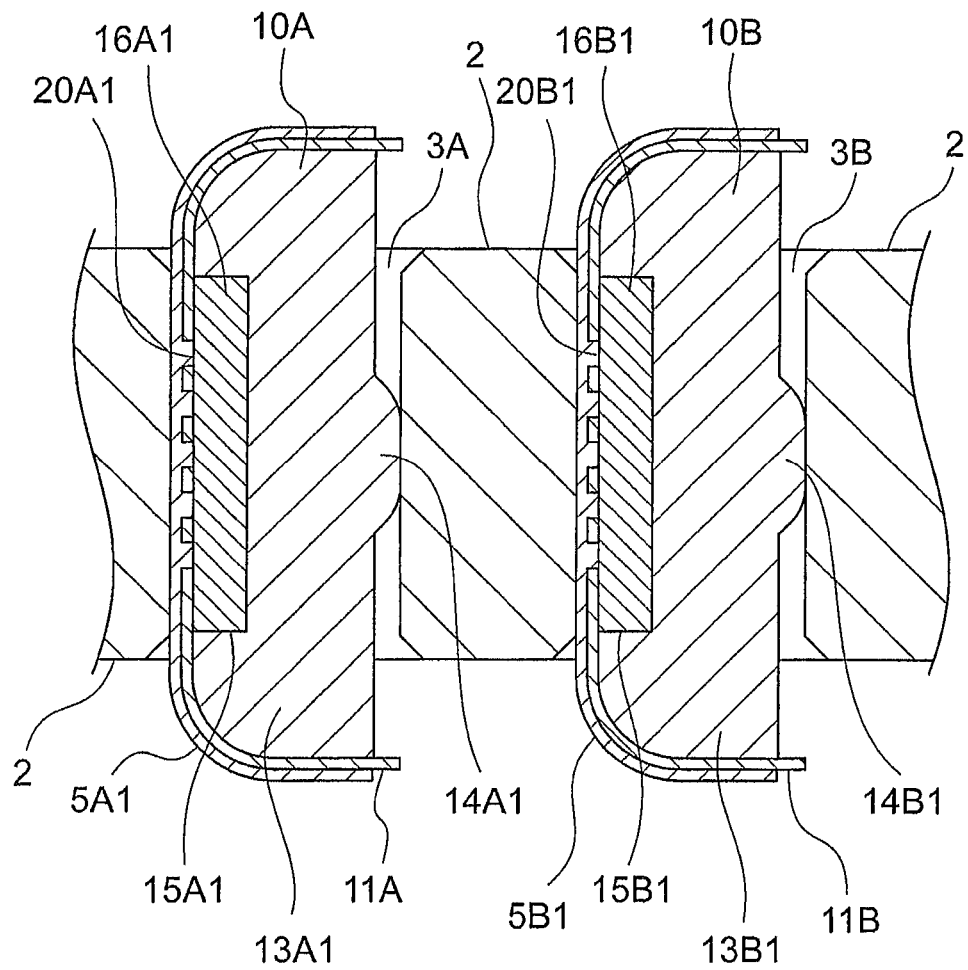
FIG. 5 is a cross-sectional view of conduction path support portions 13A1 and 13B1 and a frame 2.

FIG. 5 is a cross-sectional view showing a part, including the contact units 4A and 4B, of an X-X' cross section of FIG. 1. As seen from this figure, the contact units 4A and 4B are respectively inserted into and held by the frame 2. The contact unit 4A, 4B is pressed against the wall surfaces of the slit 3A, 3B due to a reaction force generated by the columnar elastic body 10A, 10B. The upper and lower end portions of the contact unit 4A, 4B both protrude from the frame 2. Portions, located at the upper and lower end portions of the conduction path support portion 13A1, 13B1, of the first conduction path 5A1, 5B1 serve as contact terminals and are brought into contact with the terminals on the connection object sides.

FIG. 6 shows a state just before connecting the connector 1 to the two connection objects. The boards 31 and 32 are respectively the connection objects of the connector 1. A description will be given herein assuming that the connection objects are both the boards, but one of them may be a semiconductor package. As shown in FIG. 6, the board 31 has on its upper surface the terminals 33 at positions corresponding to the conduction path support portions 13A1 to 13A8, 13B1 to 13B8, . . . , 13H1 to 13H8. Likewise, the board 32 has the terminals 34 (not illustrated in FIG. 6, see FIG. 7) on its lower surface.

FIG. 7 shows a state where, starting from the state of FIG. 6, the connector 1 is held between the boards 31 and 32. Deformation of the first conduction paths 5A1 to 5A8, 5B1 to 5B8, . . . , 5H1 to 5H8 in this event will be described using the first conduction path 5A1 as a representative example and referring again to FIG. 4. Consideration is given by dividing the first conduction path 5A1 into five parts 41 to 45 as shown in FIG. 4.

The parts 41 and 45 are flat thin films parallel to the boards 32 and 31 and serve as contact terminals for contact with the terminals of the boards 32 and 31. The first conduction path 5A1 is a metal thin film having a thickness of, for example, about 10 to 20 μm and has sufficient flexibility. Therefore, the contact area between the part 41, 45 and the terminal of the board 32, 31 can be made large and, as a result, the contact resistance can be suppressed to be low.

The parts 42 and 44 are thin films respectively connecting the parts 41 and 45, as the surfaces parallel to the boards 32 and 31, and the later-described part 43 to each other and each have a quadrant cross section. The parts 42 and 44 are portions that are most deformed when the connector 1 is held between the boards 32 and 31. Regions, which the parts 42 and 44 are in contact with through the film 11A, of the columnar elastic body 10A are pushed and deformed rightward in FIG. 7 according to the degree of pressing of the connector 1 by the boards 32 and 31. Since the parts 42 and 44 have sufficient flexibility, even if the parts 42 and 44, along with the film 11A, are wound around the columnar elastic body 10A, the parts 42 and 44 hardly hinder elastic deformation of the columnar elastic body 10A and are deformed following the elastic deformation of the columnar elastic body 10A.

The part 43 is a flat thin film perpendicular to the boards 32 and 31 and is connecting the parts 42 and 44 to each other. As also seen from FIG. 7, when the contact unit 4A is mounted to the frame 2, most of the part 43 is received in the slit 3A. Therefore, when the connector 1 is held between the boards 32 and 31, while the parts 41, 42, 44, and 45 are deformed, most of the part 43 is hardly deformed. In particular, the portion, received in the slit 3A, of the part 43 is not deformed at all because it is covered by the frame 2.

In this manner, when connecting the boards 32 and 31 to each other using the connector 1, while the upper and lower end portions of the conduction path support portion 13A1 are deformed, its portion received in the slit 3A is not deformed. Therefore, the portion, received in the slit 3A, of the first conduction path 5A1 does not need to be deformed following elastic deformation of the columnar elastic body 10A and thus is not required to have flexibility.

Figure 8:
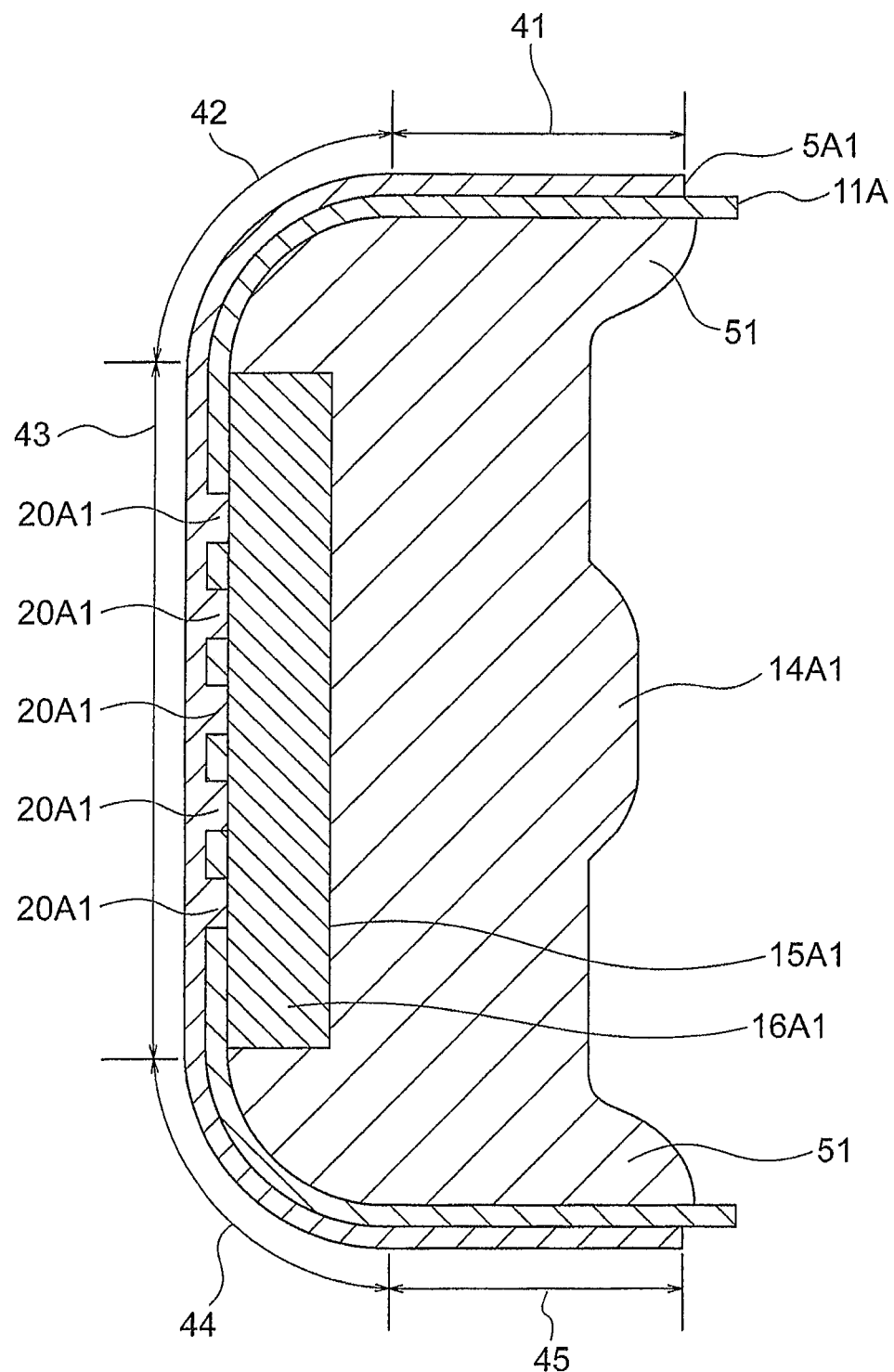
FIG. 8 is a cross-sectional view of the conduction path support portion 13A1 for explaining deformation of the contact unit 4A in the state where the connector 1, the board 31, and the board 32 are connected to each other.
Figure 9:
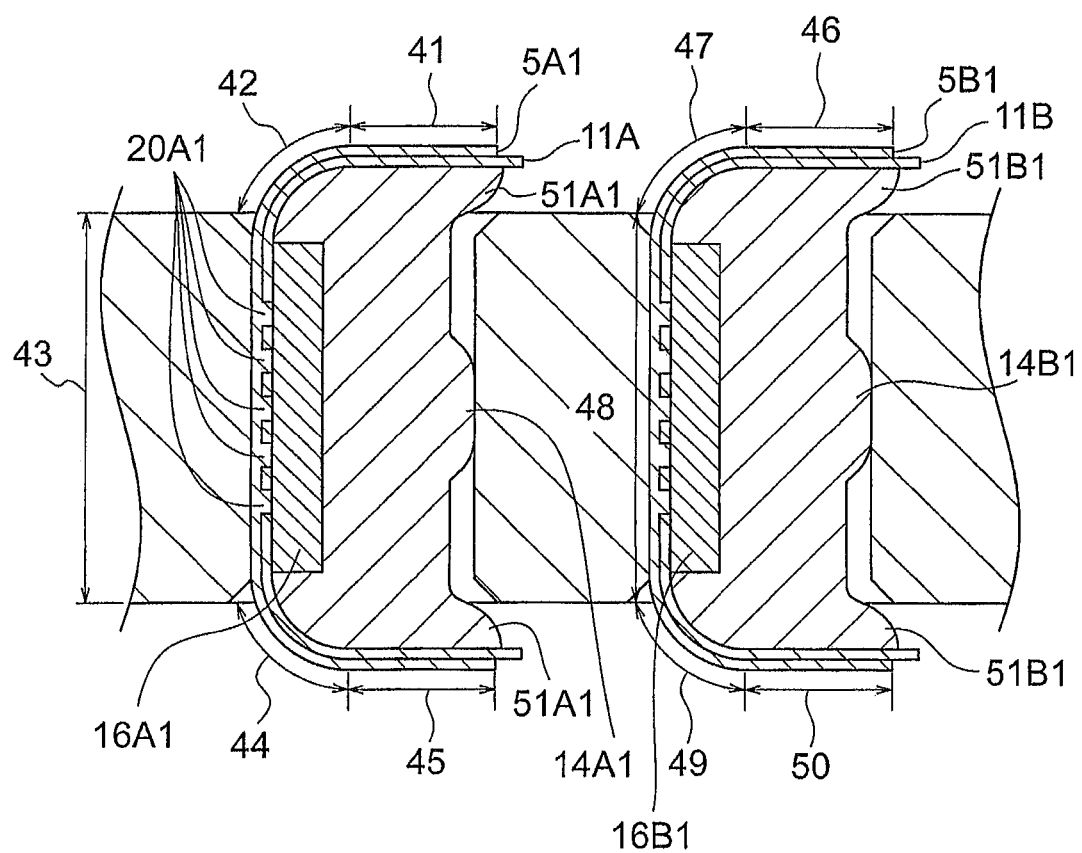
FIG. 9 is a cross-sectional view of the conduction path support portions 13A1 and 13B1 and the frame 2 for explaining deformation of the contact units 4A and 4B in the state where the connector 1, the board 31, and the board 32 are connected to each other.

Based on this knowledge, the present inventors provide the second conduction path 16A1 along the portion, received in the slit 3A, of the first conduction path 5A1. When the board 32 is pushed downward and the board 31 is pushed upward from the state of FIG. 7, the conduction path support portions 13A1 to 13A8, 13B1 to 13B8, . . . , 13H1 to 13H8 of the contact units 4A to 4H are respectively deformed. This will be described using the conduction path support portion 13A1 as a representative example. As shown in FIGS. 8 and 9, protuberances 51A1 are formed on the right side in the figures due to elastic deformation of the upper and lower end portions of the conduction path support portion 13A1. In this event, following this elastic deformation, particularly the parts 42 and 44 are deformed so as to fall toward the right side in the figures. On the other hand, the part 43 is not deformed at all.

As described above, the thickness of the first conduction path 5A1 is about 10 to 20 μm, while the thickness of the second conduction path 16A1 is about 0.1 mm. Since the thickness of the second conduction path 16A1 is about five to ten times the thickness of the first conduction path 5A1, the second conduction path 16A1 is extremely difficult to bend and thus is hard compared to the first conduction path 5A1. However, since the second conduction path 16A1 is arranged along the non-deforming region of the part 43, deformation of the parts 41, 42, 44, and 45 is not affected at all.

On the other hand, by providing the second conduction path 16A1, it is possible to reduce the resistance of the first conduction path 5A1 between its terminals. The first conduction path 5A1 can be deemed to be a path in which five resistances, i.e. the parts 41 to 45, are connected in series. In this embodiment, by connecting the second conduction path 16A1 to the first conduction path 5A1 through the connecting conduction paths 20A1, it is possible to substantially increase the cross-sectional area of the part 43 to thereby reduce the resistance thereof.

This will be described using specific numerical values given as an example. It is to be noted that the numerical values given herein are for facilitating understanding and thus are not necessarily actual numerical values of the connector 1. It is assumed that resistances of the parts 41 to 45 are respectively 5Ω, 5Ω, 10Ω, 5Ω, and 5Ω in order. In this event, the total resistance of the first conduction path 5A1 between its terminals, i.e. the series resistance from the part 41 to the part 45, is 30Ω.

In this embodiment, the second conduction path 16A1, in the form of the metal plate which is about five to ten times thicker than the first conduction path 5A1, is provided along the part 43. This makes it possible to reduce the resistance of the part 43 to 10. As a result, when the second conduction path 16A1 is connected to the first conduction path 5A1 through the connecting conduction paths 20A1, the total resistance of the first conduction path 5A1 between its terminals becomes 21Ω.

While the path length of the part 43 is long and thus the resistance thereof is also high compared to the parts 41, 42, 44, and 45, the total resistance of the first conduction path 5A1 between its terminals can be effectively reduced by connecting the second conduction path 16A1 in parallel with the part 43. That is, by reducing the resistance of the part 43 occupying the large part of the conduction path between two connection objects (boards 31 and 32), it is possible to reduce the resistance of the entire conduction path (first conduction path between its terminals) and thus to reduce the calorific value in the entire conduction path. As a result, the current capacity of the connector 1 can be set high.

(First Modification)

Next, a first modification of the above-mentioned embodiment will be described. In the first modification, contact units 60A to 60H are used instead of the contact units 4A to 4H of the connector 1. Compared to the contact units 4A to 4H, the contact units 60A to 60H differ in the arrangement of a second conduction path.

Figure 10:
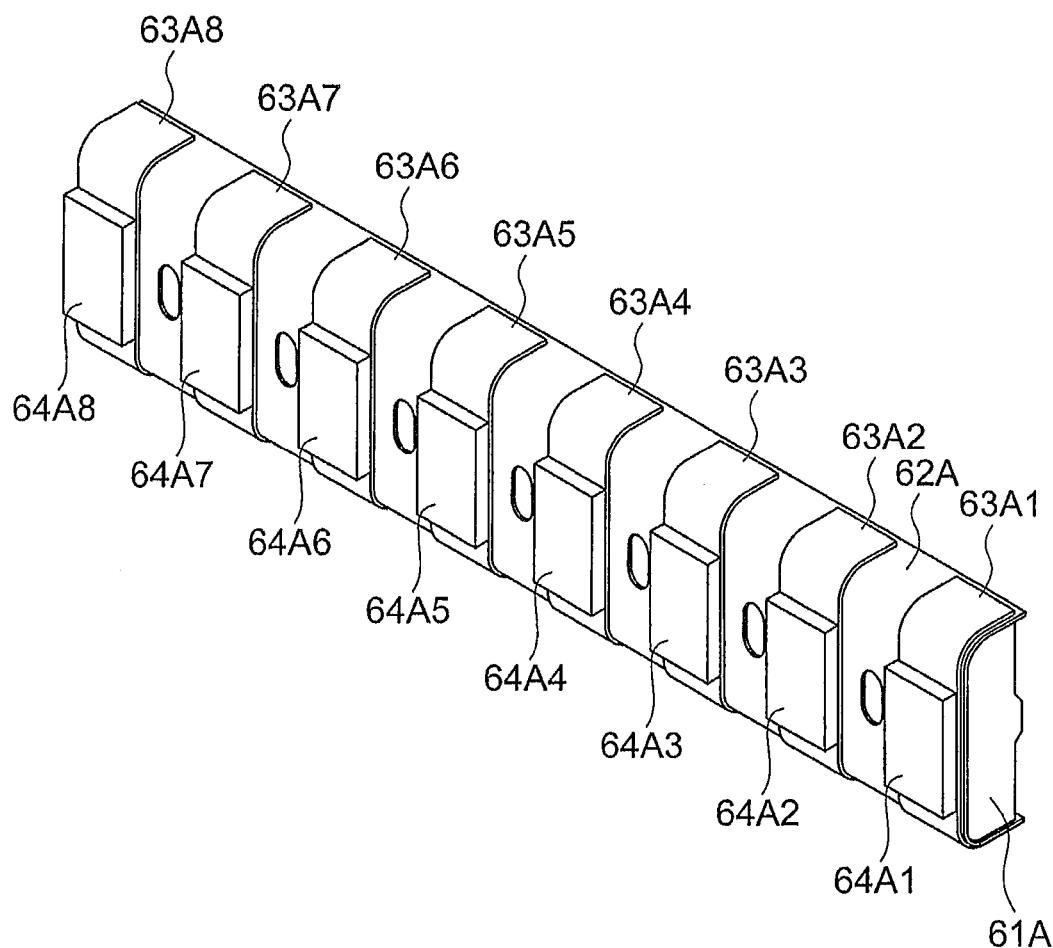
FIG. 10 is a front perspective view of a contact unit 60A which is used in a first modification of the embodiment instead of the contact unit 4A.
Figure 11:
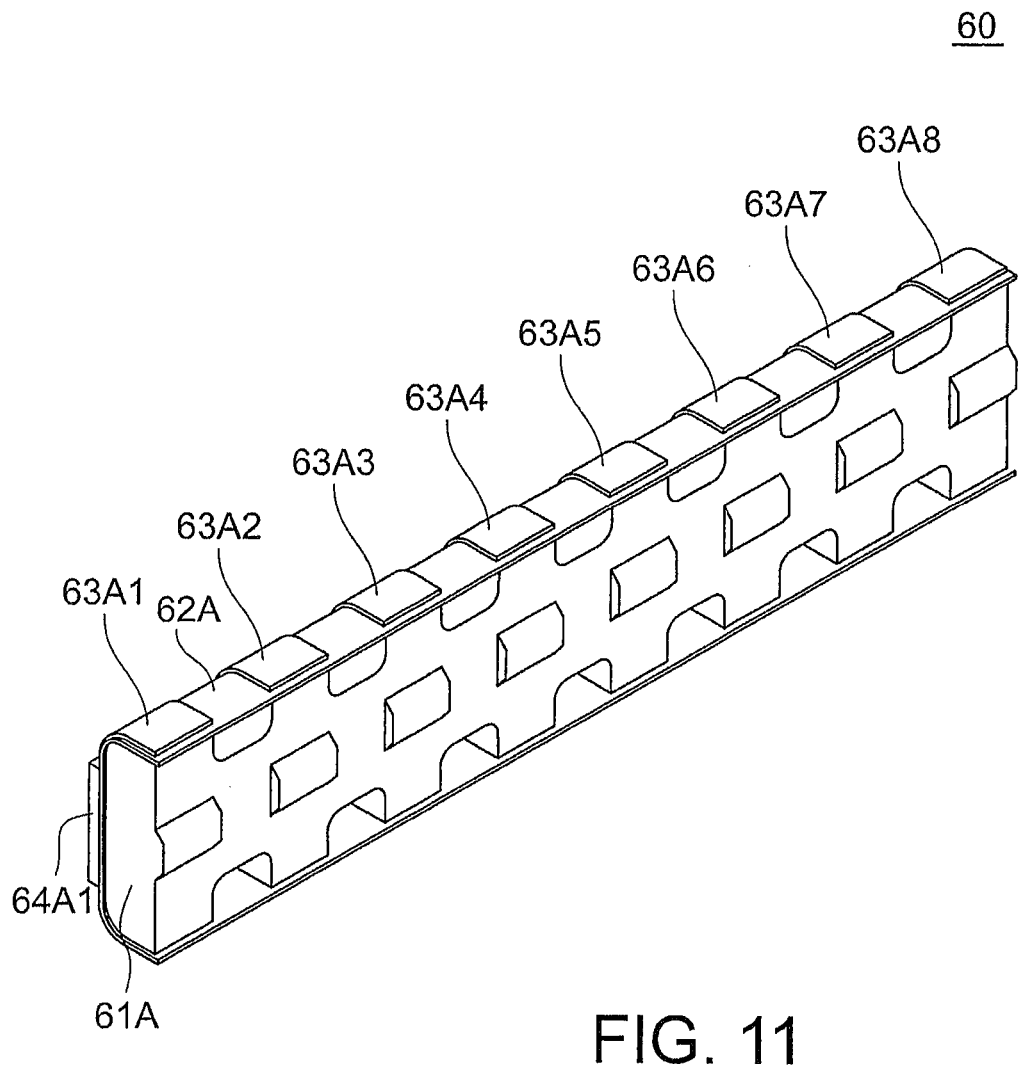
FIG. 11 is a rear perspective view of the contact unit 60A.

Since the contact units 60A to 60H have the same structure, only the contact unit 60A will be described herein for brevity of description. As shown in FIGS. 10 and 11, the contact unit 60A is such that side surfaces of a columnar elastic body 61A are covered with an insulating film 62A and that eight first conduction paths 63A1 to 63A8 each in the form of a conductor thin film are arranged on the film 62A so as to be spaced apart from each other at regular intervals.

Figure 2:
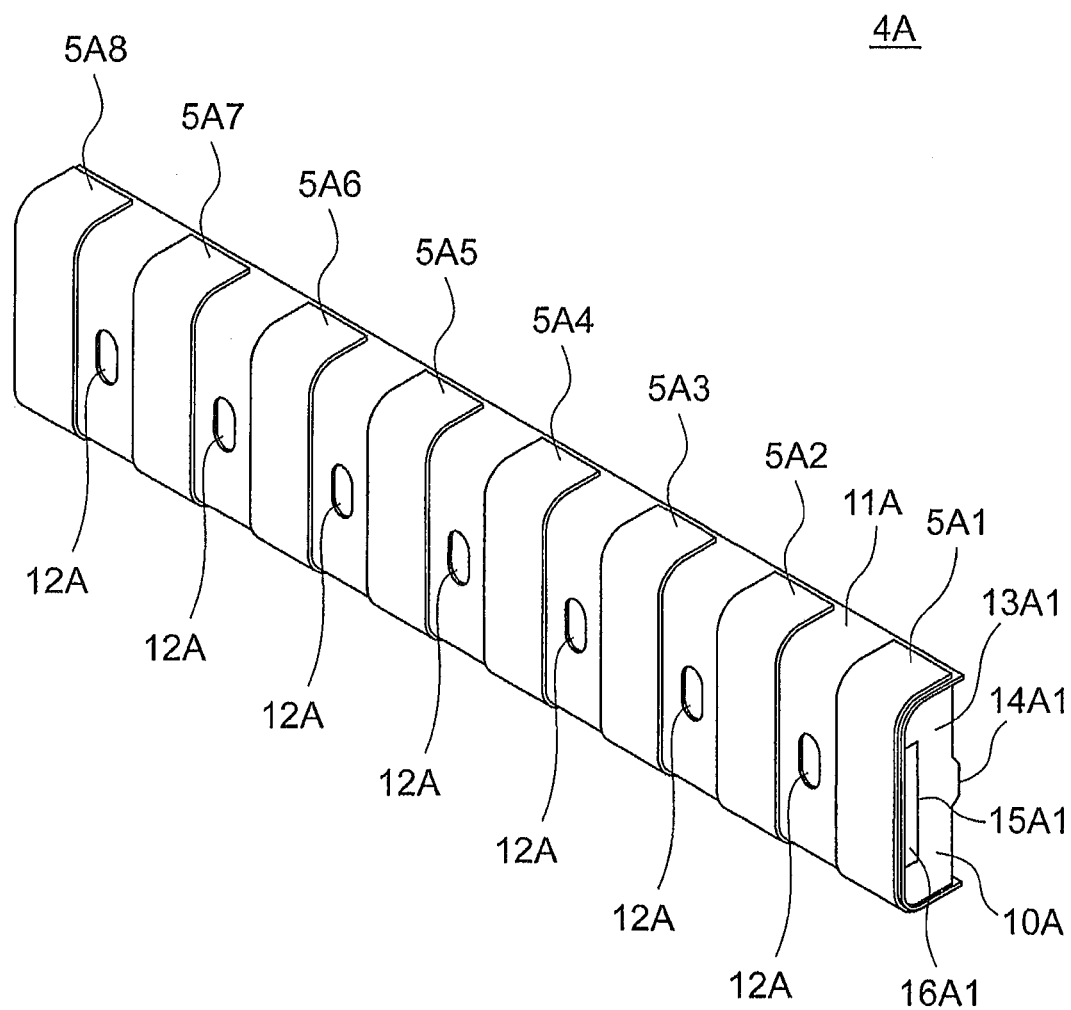
FIG. 2 is a front perspective view of a contact unit 4A of the connector 1.

As shown in FIGS. 2 and 3, for example, in the contact unit 4A, the second conduction path 16A1 is provided at the position between the first conduction path 5A1 and the columnar elastic body 10A and the first conduction path 5A1 and the second conduction path 16A1 are connected to each other by providing the connecting conduction paths 20A1 through the through holes provided in the film 11A.

Figure 12:
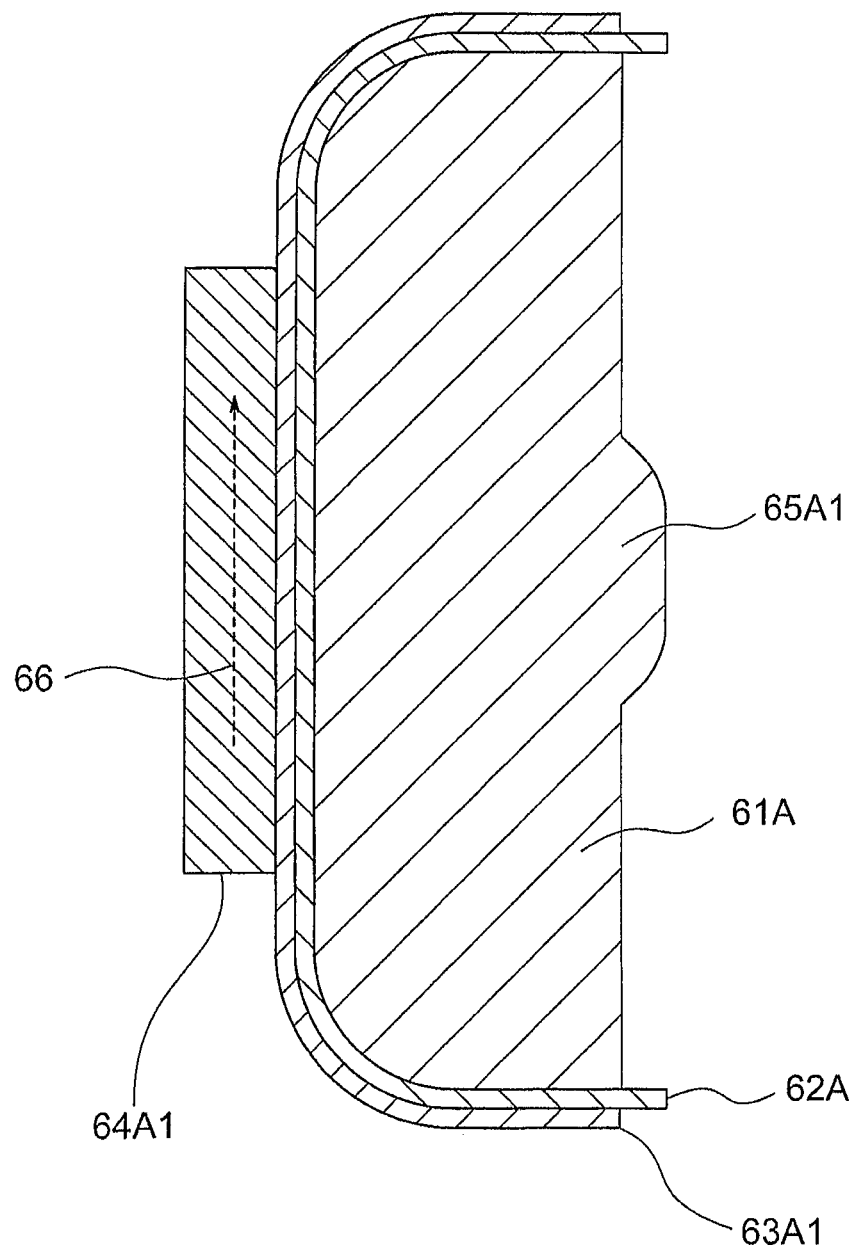
FIG. 12 is a cross-sectional view of the contact unit 60A at its conduction path support portion.
Figure 13:
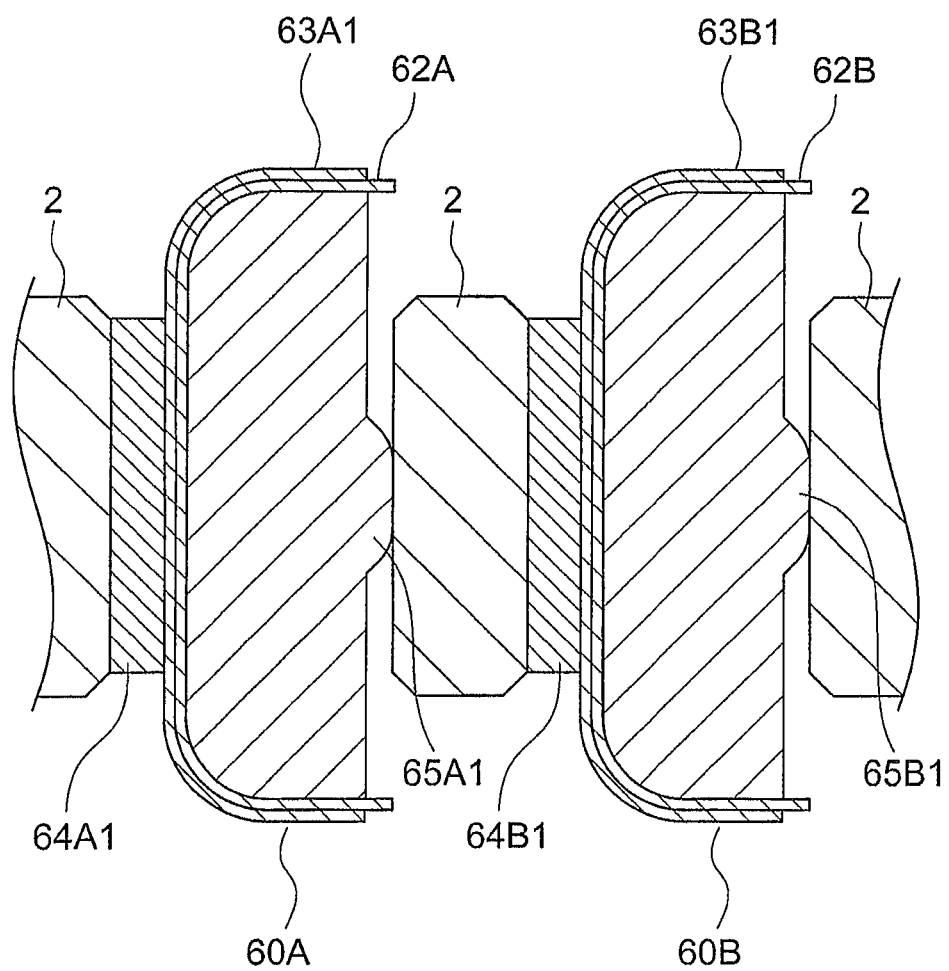
FIG. 13 is a cross-sectional view of contact units 60A and 60B at their conduction path support portions and a frame 2.

On the other hand, as shown in FIGS. 12 and 13, in the contact unit 60A, a part or the whole of a surface of a conductor plate, which serves as each of second conduction paths 64A1 to 64A8, is joined directly to a surface, opposite to a surface on the side where the film 62A is provided, of each of the first conduction paths 63A1 to 63A8. As illustrated, the width of the second conduction path 64A1-64A8 is equal to that of the first conduction path 63A1-63A8. The thickness of the first conduction path 63A1-63A8 and the thickness of the second conduction path 64A1-64A8 are respectively equal to the thickness of the first conduction path 5A1-5A8 and the thickness of the second conduction path 16A1-16A8.

In the above-mentioned embodiment, the connecting conduction paths 20A1 serve to connect the first conduction path 5A1 and the second conduction path 16A1 to each other. On the other hand, in this modification, the joining surface between the first conduction path 63A1 and the second conduction path 64A1 serves this role. By electrically connecting the first conduction path 63A1 and the second conduction path 64A1 to each other in this manner, a current flows in the first conduction path 63A1 and further a current flows in the second conduction path 64A1 as indicated by an arrow 66. Consequently, it is possible to reduce the resistance of the first conduction path 63A1 between its terminals. As a result, the current capacity of a connector can be set high. Since the second conduction path 64A1 is provided in a non-deforming region of the first conduction path 63A1, the second conduction path 64A1 does not hinder elastic deformation of the columnar elastic body 61A at upper and lower end portions of the first conduction path 63A1.

(Second Modification)

Figure 14:
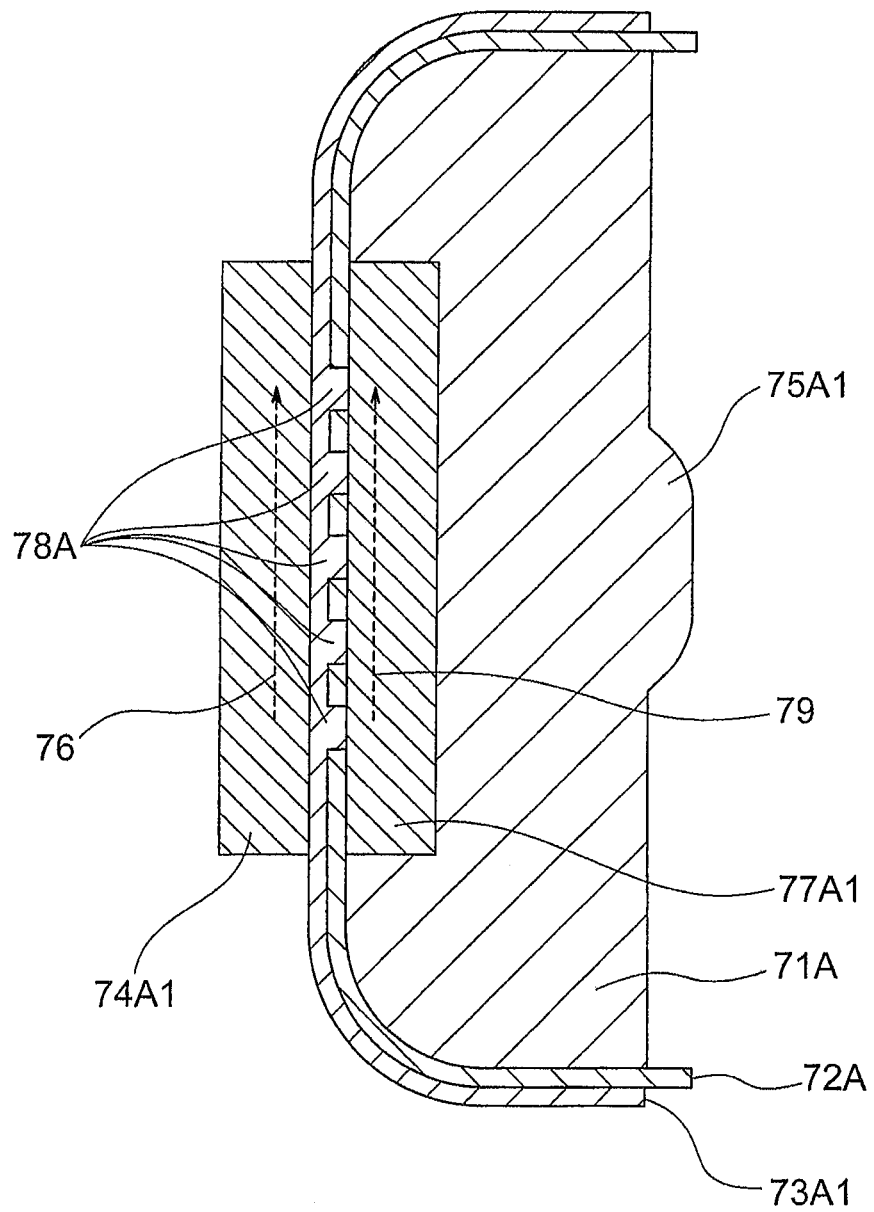
FIG. 14 is a cross-sectional view of a contact unit which is used in a second modification of the embodiment instead of the contact unit 4A.

A second modification will be described. In the embodiment and the first modification, the conductor plate which serves as the second conduction path is provided along one of the surfaces of the first conduction path. On the other hand, in the second modification, as shown in FIG. 14, a second conduction path 74A1 and a third conduction path 77A1 are provided on both sides of a first conduction path 73A1 in the form of a conductor thin film, wherein the second conduction path 74A1 is provided on the left side in the figure and the third conduction path 77A1 is provided on the right side in the figure.

As in the first modification, the first conduction path 73A1 and the second conduction path 74A1 are electrically connected to each other by joining a part or the whole of a surface of a conductor plate, which serves as the second conduction path 74A1, directly to the first conduction path 73A1. The relationship of the thickness and width between the first conduction path 73A1 and the second conduction path 74A1 is the same as in the first modification.

The third conduction path 77A1 corresponds to the second conduction path 16A1 in the embodiment. The first conduction path 73A1 and the third conduction path 77A1 are electrically connected to each other through connecting conduction paths 78A provided through through holes of an insulating film 72A. The relationship of the thickness and width between the first conduction path 73A1 and the third conduction path 77A1 is the same as in the embodiment.

By providing, in this manner, not only the first conduction path 73A1 but also the second conduction path 74A1 and the third conduction path 77A1, which are connected to the first conduction path 73A1, along a non-deforming region of the first conduction path 73A1, a current flows in the first conduction path 73A1 and, in addition, a current flows in the second conduction path 74A1 as indicated by an arrow 76 and a current flows in the third conduction path 77A1 as indicated by an arrow 79. Consequently, it is possible to reduce the resistance of the first conduction path 73A1 between its terminals without hindering elastic deformation of the first conduction path 73A1. As a result, the current capacity of a connector can be set high.

(Third Modification)

A third modification will be described. In the third modification, contact units 90A to 90H are used instead of the contact units 4A to 4H of the connector 1. Compared to the contact units 4A to 4H, the contact units 90A to 90H differ in the shape of a second conduction path. Further, the contact units 90A to 90H differ in the shape of a columnar elastic body compared to the above-mentioned embodiment and modifications.

Figure 15:
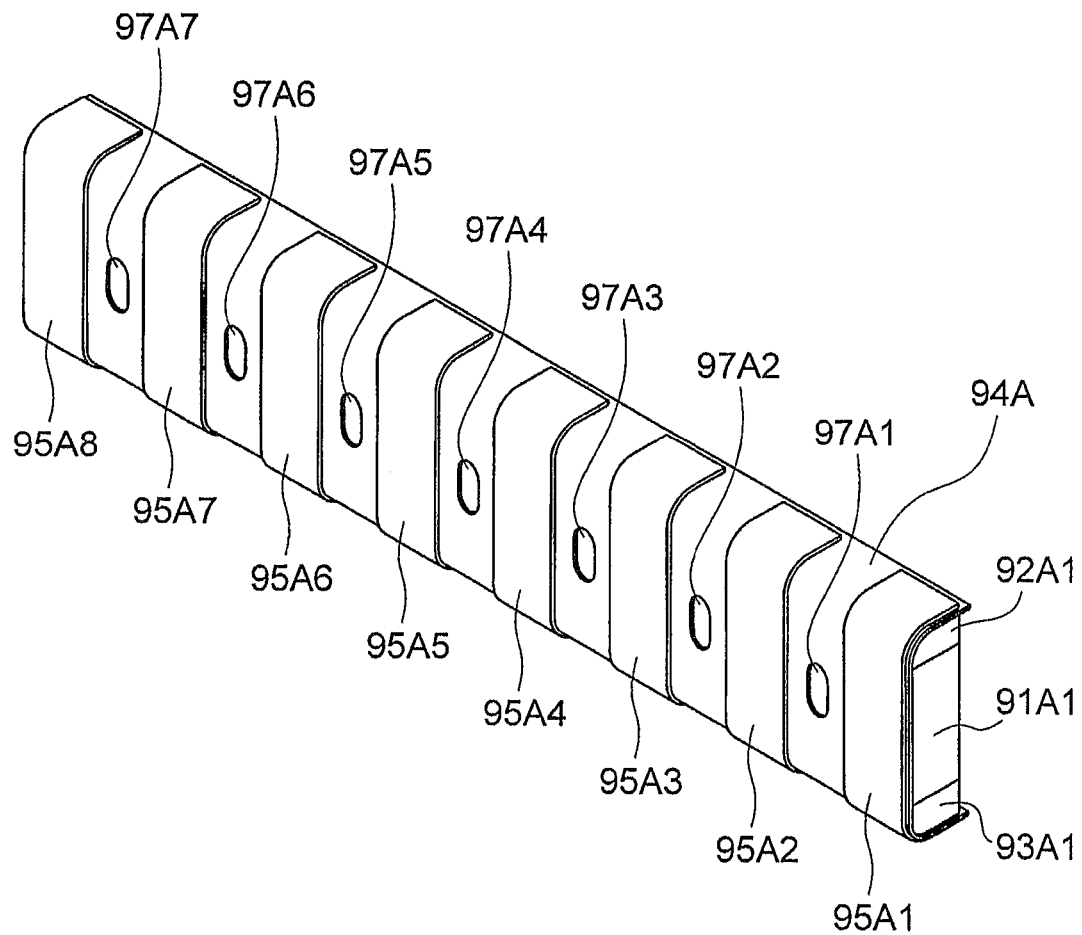
FIG. 15 is a front perspective view of a contact unit 90A which is used in a third modification of the embodiment instead of the contact unit 4A.
Figure 16:
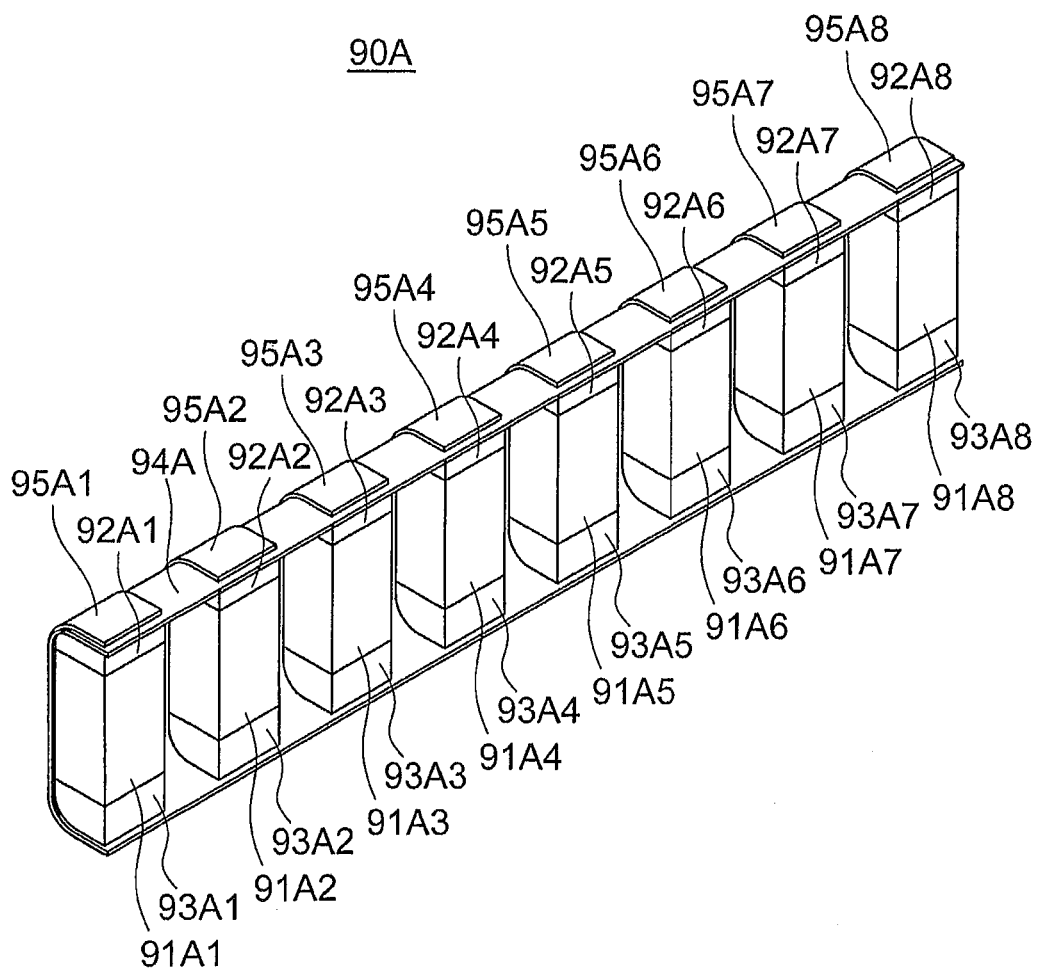
FIG. 16 is a rear perspective view of the contact unit 90A.
Figure 17:
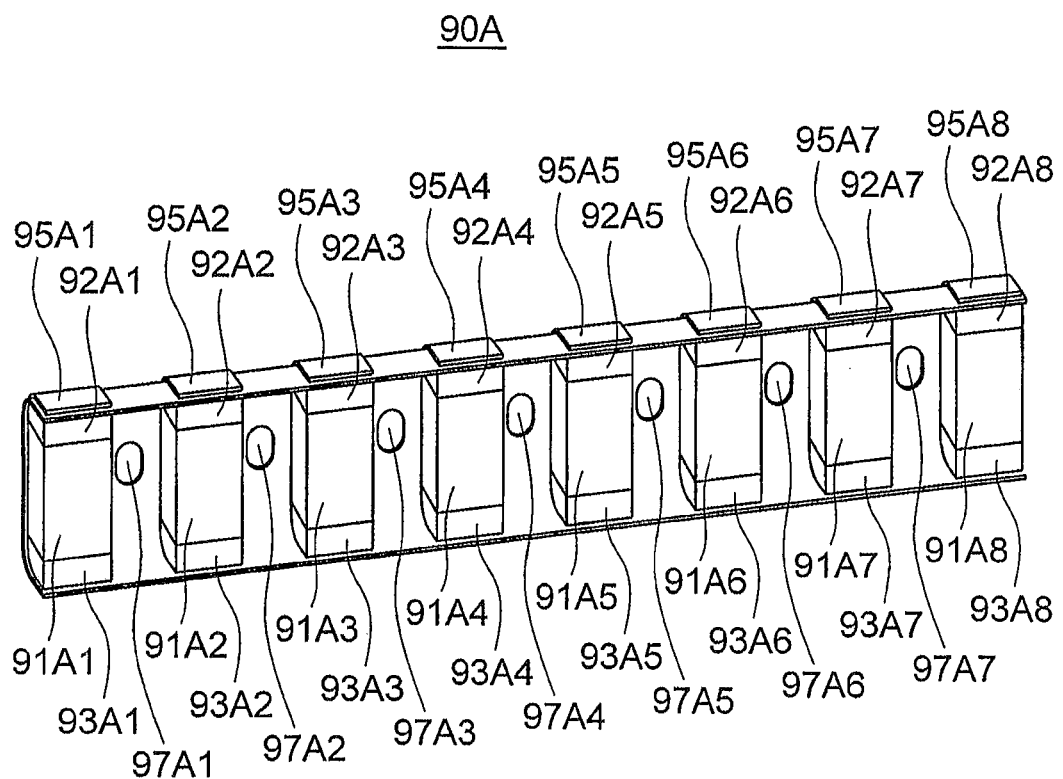
FIG. 17 is a rear perspective view of the contact unit 90A.

Since the contact units 90A to 90H have the same structure, only the contact unit 90A will be described herein for brevity of description. As shown in FIGS. 15, 16, and 17, the contact unit 90A comprises eight columnar bodies each comprising a rectangular parallelepiped second conduction path 91A1-91A8 made of a conductor, an elastic body 92A1-92A8 provided on an upper surface of the second conduction path 91A1-91A8, and an elastic body 93A1-93A8 provided on a lower surface of the second conduction path 91A1-91A8. These eight columnar bodies are arranged to be spaced apart from each other at regular intervals and are covered with an insulating film 94A in three directions. On the insulating film 94A, eight first conduction paths 95A1 to 95A8 each in the form of a belt-like conductor thin film are disposed at positions corresponding to the eight columnar bodies. The film 94A has support holes 97A1 to 97A7 each provided in a region between adjacent two of the first conduction paths 95A1 to 95A8. The support holes 97A1 to 97A7 respectively correspond to support projections 96A1 to 96A7 provided in a slit 3A of a frame 2. See FIGS. 18 and 19.

As described in the embodiment, this invention pays attention to the fact that when connecting two connection objects (boards 31 and 32) to each other, while the upper and lower end portions of the portion supporting the first conduction path (conduction path support portion 13A1) are deformed, its portion received in the frame (slit 3A) is not deformed and thus is not required to have flexibility. That is, the portion supporting the first conduction path may be a substantially rigid body with respect to its portion received in the frame and, further, as the thickness of the conductor plate serving as the second conduction path increases, the resistance of the first conduction path between its terminals can be reduced. This third modification is a result of further development of this idea.

Figure 18:
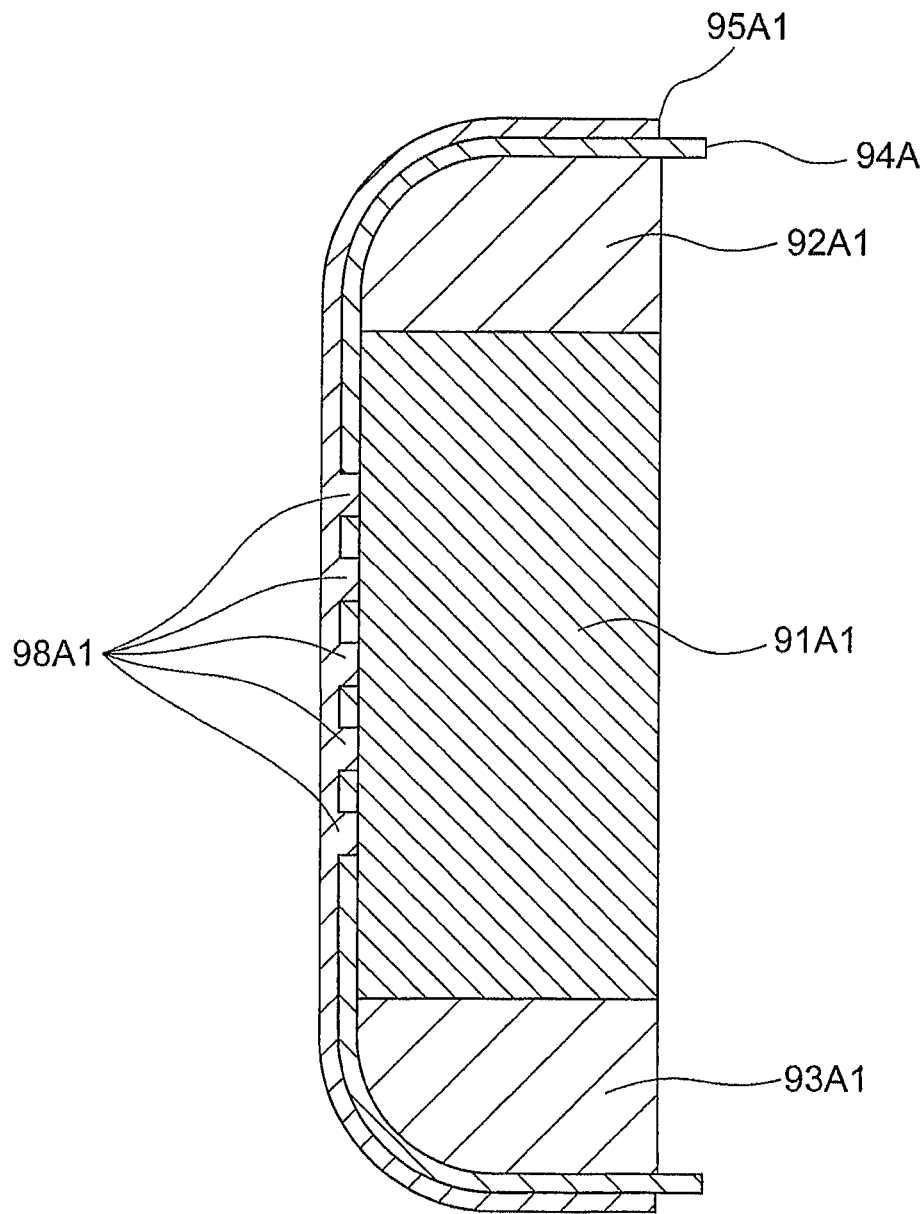
FIG. 18 is a cross-sectional view of the contact unit 90A at its conduction path support portion.
Figure 19:
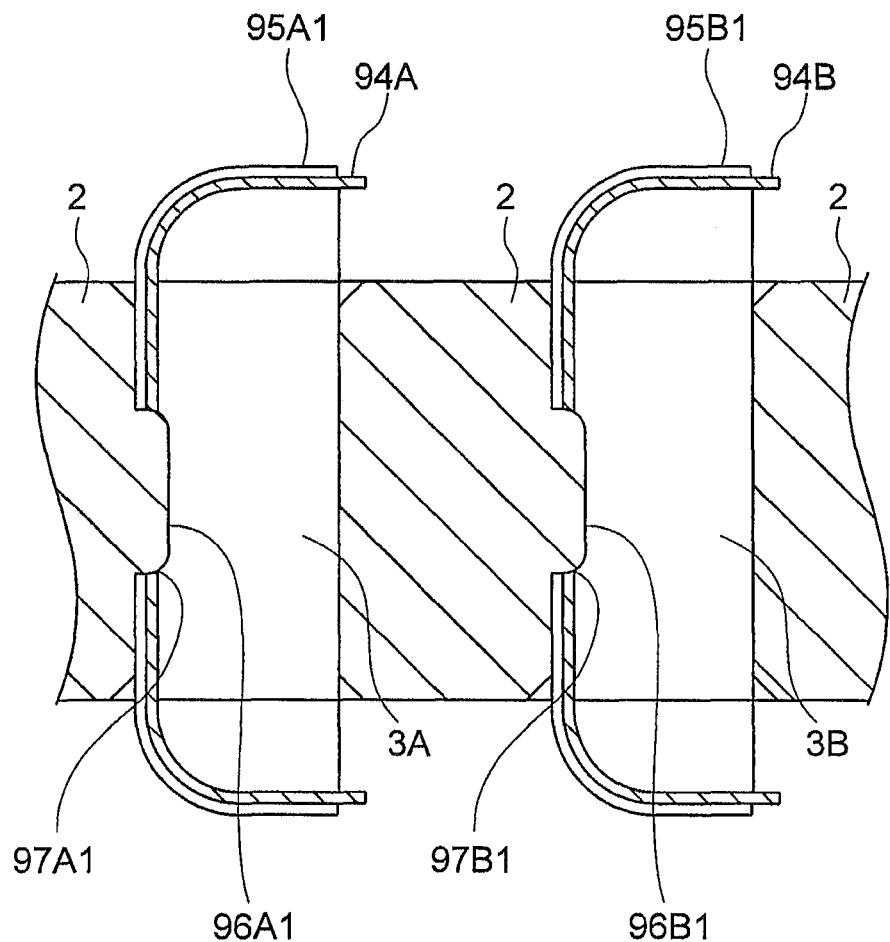
FIG. 19 is a cross-sectional view of contact units 90A and 90B at their support holes 97A1 and 97B1 and a frame 2.
Figure 20:
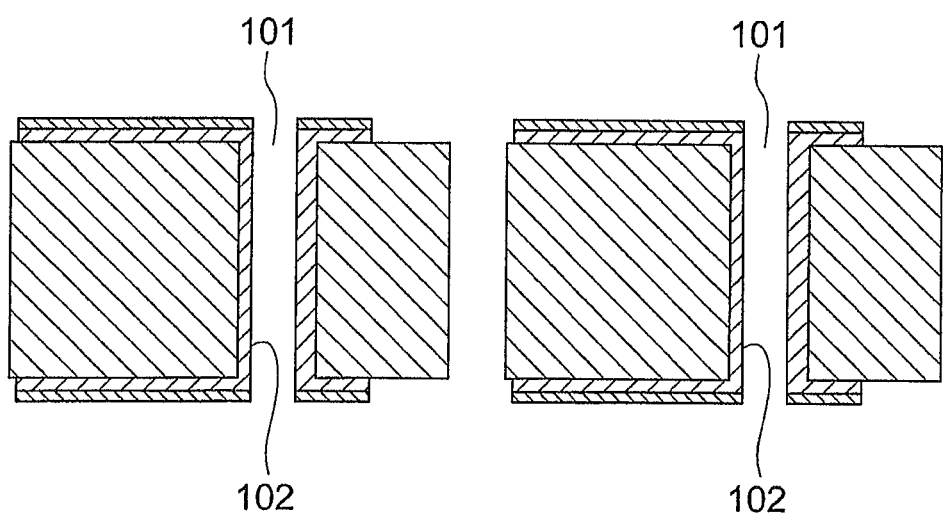
FIG. 20 is a cross-sectional view of a connector described in Patent Document 1.
Figure 21:
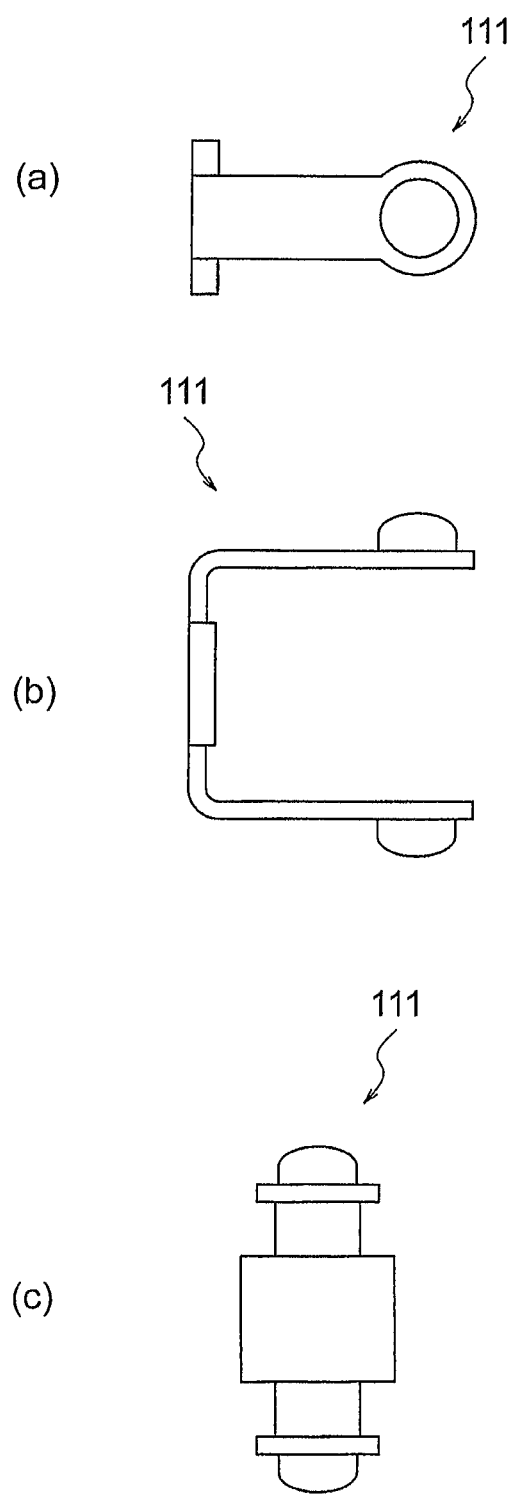
FIG. 21 shows three orthographic views (plan, side, and rear views) of a metal fitting 111 used in a connector described in Patent Document 2.
Figure 22:
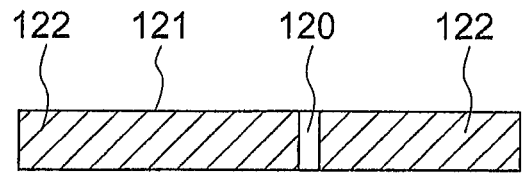
FIG. 22 is a diagram for explaining a method of manufacturing a connector described in Patent Document 3.
Figure 22:
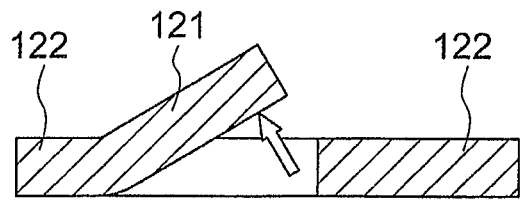
Figure 22:
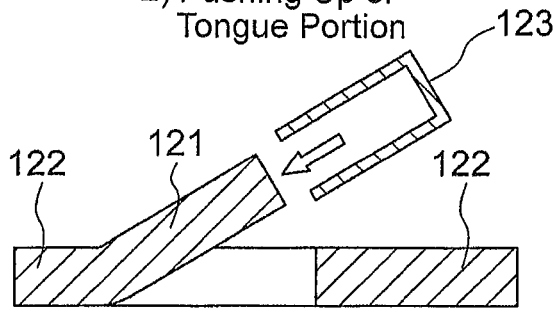
Figure 22:
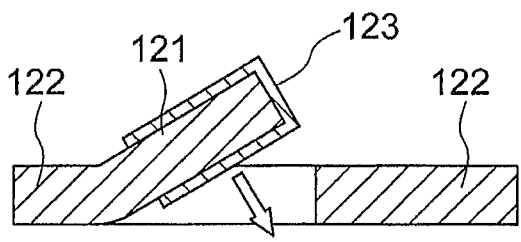
Figure 22:
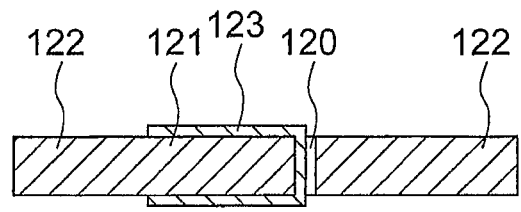

Referring to FIGS. 18 and 19, this modification will be further described using the columnar body comprising the second conduction path 91A1 as a representative example. On the upper side of the rectangular parallelepiped second conduction path 91A1 made of a conductor such as a copper alloy, the elastic body 92A1 of a generally rectangular prism having a bottom surface which is the same in shape and size as the upper surface of the second conduction path 91A1 is provided. The elastic body 92A1 is not a perfect rectangular prism, wherein one upper side is chamfered into a quadrant in cross section. Likewise, the elastic body 93A1 of a generally rectangular prism having a bottom surface which is the same in shape and size as the lower surface of the second conduction path 91A1 is provided on the lower side of the second conduction path 91A1. One lower side of the elastic body 93A1 is also chamfered into a quadrant in cross section in the same direction as that in the elastic body 92A1. The film 94A covers the columnar body from an upper surface of the elastic body 92A1 to a lower surface of the elastic body 93A1 through the chamfered side of the elastic body 92A1, a side surface of the second conduction path 91A1, and the chamfered side of the elastic body 93A1. The conductor thin film serving as the first conduction path 95A1 is provided on the film 94A. Through holes are provided in a region, covering the side surface of the second conduction path 91A1, of the film 94A and, through these through holes, connecting conduction paths 98A1 are provided to electrically connect the first conduction path 95A1 and the second conduction path 91A1 to each other. By providing the connecting conduction paths 98A1, the resistance of a portion, received in the frame 2, of the first conduction path 95A1 is reduced so that the resistance of the entire first conduction path 95A1 from its upper end portion to its lower end portion is reduced. As a result, the current capacity of a connector can be set high. This also applies to the other columnar bodies each comprising the corresponding second conduction path.

As seen particularly from FIGS. 15, 17, and 19, when the contact units 90A and 90B are respectively inserted into the slits 3A and 3B, the support projections 96A1, 96A2, ..., 96A7, 96B1, 96B2, ..., 96B7 provided in the slits 3A and 3B are respectively fitted into the support holes 97A1, 97A2, ..., 97A7, 97B1, 97B2, ..., 97B7. Consequently, the contact units 90A and 90B are fixed to the frame 2. Incidentally, the support projections 96A2, 96A3, ..., 96A7, 96B2, 96B3, ..., 96B7 and the support holes 97B2, 97B3, ..., 97B7 are not illustrated.

While this invention has been described with reference to the embodiment and its modifications, this invention is not limited thereto.

For example, in the connectors of the embodiment and its modifications, eight first conduction paths are provided on each columnar elastic body. That is, these connectors are each a 64-pin connector having eight 8-pin columnar elastic bodies. However, this invention is not limited thereto. The number of pins provided on one columnar elastic body and the number of columnar elastic bodies are respectively optional.

In the embodiment and its modifications, the description has been given assuming that the connection objects are both the boards. However, this invention is not limited thereto and one of them may be a semiconductor package such as LGA (Land Grid Array) or BGA (Ball Grid Array).

What is claimed is:

1. A connector adapted to be held between two connection objects for electrically connecting the two connection objects to each other and comprising a contact unit and a frame,
    wherein the contact unit comprises:
    an insulating elastic body;
    a first conduction path comprising a conductor thin film that is arranged along a peripheral surface of the elastic body;
    a second conduction path comprising a conductor that is arranged along the conductor thin film of the first conduction path; and
    a connecting conduction path electrically connecting the first conduction path and the second conduction path to each other,
    wherein the frame is non-conductive and has a through hole passing through the frame,
    wherein the frame supports the contact unit so that the second conduction path is entirely received in the through hole, and
    wherein the frame supports the contact unit so that the first conduction path exposed from one of openings of the through hole is brought into contact with one of the two connection objects, while the first conduction path exposed from the other of the openings of the through hole is brought into contact with the other of the two connection objects.

2. The connector according to claim 1,
    wherein the elastic body is columnar,
    wherein a plurality of first conduction paths are arranged at a predetermined pitch in a longitudinal direction of the columnar elastic body,
    wherein the frame supports the contact unit so that the first conduction paths are brought into contact with one of the two connection objects at one side in a short-side direction of the columnar elastic body and brought into contact with the other of the two connection objects at the other side in the short-side direction of the columnar elastic body, and
    wherein mutually independent conducting paths are established between the two connection objects through the first conduction paths.

3. The connector according to claim 2, further comprising a plurality of columnar elastic bodies, wherein the frame comprises a plurality of through holes each corresponding to one of the columnar elastic bodies.

4. The connector according to claim 1,
    wherein the first conduction path has a belt-like shape,
    wherein the second conduction path has a width equal to that of the first conduction path, and
    wherein the second conduction path comprises a plate-like conductor member having a thickness greater than that of the first conduction path.

5. The connector according to claim 1, wherein the connecting conduction path is formed by joining a part or the whole of the second conduction path to the first conduction path.

6. The connector according to claim 1, wherein the second conduction path is arranged between the first conduction path and the elastic body.

7. The connector according to claim 1,
    wherein the first conduction path is arranged between the second conduction path and the elastic body, and
    wherein the connecting conduction path is formed by joining a part or the whole of the second conduction path to the first conduction path.

8. The connector according to claim 1, further comprising a third conduction path that is formed by the thin film of the first conduction path and is independent from the second conduction path and a connecting conduction path that electrically connects the first conduction path and the third conduction path to each other,
    wherein the first conduction path is arranged between the second conduction path and the third conduction path.

9. The connector according to claim 1, further comprising a columnar body comprising the elastic body at each of upper and lower end portions thereof and a conductor serving as the second conduction path between the upper and lower end portions, wherein the conductor thin film of the first conduction path is arranged along a peripheral surface of the columnar body.

10. The connector according to claim 1, further comprising an insulating film,
    wherein the insulating film has a through hole, and
    wherein the connecting conduction path passes through the through hole of the insulating film.

* * * * *